United States Patent
Arayashiki et al.

(10) Patent No.: US 10,734,449 B2
(45) Date of Patent: Aug. 4, 2020

(54) STORAGE DEVICE

(71) Applicant: TOSHIBA MEMORY CORPORATION, Minato-ku, Tokyo (JP)

(72) Inventors: Yusuke Arayashiki, Yokkaichi Mie (JP); Nobuyuki Momo, Yokkaichi Mie (JP); Motohiko Fujimatsu, Kuwana Mie (JP); Akira Hokazono, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/289,651

(22) Filed: Feb. 28, 2019

(65) Prior Publication Data

US 2020/0098829 A1 Mar. 26, 2020

(30) Foreign Application Priority Data

Sep. 20, 2018 (JP) .................................. 2018-176088

(51) Int. Cl.
*H01L 27/24* (2006.01)
*H01L 45/00* (2006.01)

(52) U.S. Cl.
CPC ...... *H01L 27/2481* (2013.01); *H01L 27/2436* (2013.01); *H01L 45/142* (2013.01); *H01L 45/144* (2013.01); *H01L 45/146* (2013.01); *H01L 45/147* (2013.01)

(58) Field of Classification Search
CPC ............. H01L 27/2481; H01L 27/2436; H01L 45/146; H01L 45/147
See application file for complete search history.

(56) References Cited

U.S. PATENT DOCUMENTS

| | | |
|---|---|---|
| 9,123,392 B1 | 9/2015 | Yan et al. |
| 9,190,147 B2 | 11/2015 | Minemura et al. |
| 2013/0229846 A1* | 9/2013 | Chien ................. H01L 27/2454 365/51 |
| 2017/0200676 A1 | 7/2017 | Jeong et al. |
| 2017/0352678 A1 | 12/2017 | Lu et al. |

FOREIGN PATENT DOCUMENTS

JP          4524309 B2      8/2010

* cited by examiner

*Primary Examiner* — Allison Bernstein
(74) *Attorney, Agent, or Firm* — Foley & Lardner LLP

(57) ABSTRACT

A storage device includes: a substrate; a first conductive layer extending in a first direction; a second conductive layer adjacent to the first conductive layer in a second direction, and extending in the first direction; a third conductive layer extending in a third direction; a fourth conductive layer extending in the second direction; a fifth conductive layer disposed on the second conductive layer, extending in the third direction, and being electrically connected to the fourth conductive layer; a first storage layer disposed between the third conductive layer and the fourth conductive layer; a first semiconductor layer disposed between the first conductive layer and the third conductive layer; a second semiconductor layer disposed between the second conductive layer and the fifth conductive layer; and a first gate electrode extending in the second direction and being shared by side surfaces of the first semiconductor layer and the second semiconductor layer.

11 Claims, 4 Drawing Sheets

US 10,734,449 B2

STORAGE DEVICE

CROSS-REFERENCE TO RELATED APPLICATION

This application is based upon and claims the benefit of priority from Japanese Patent Application No. 2018-176088, filed Sep. 20, 2018, the entire contents of which are incorporated herein by reference.

FIELD

Embodiments described herein relate generally to a storage device.

BACKGROUND

As a large capacity nonvolatile memory, instead of a floating gate type NAND flash memory in the related art, a development of a two-terminal resistive random access memory has been actively conducted. In this type of memory, a low voltage•low current operation, a high speed switching, or a miniaturization and high integration of memory cells is possible.

In a large capacity memory array, a large number of metal wirings called bit lines and word lines are arranged in an intersecting manner, and a memory cell is formed at an intersection of a bit line and a word line. Writing in one memory cell is performed by applying a voltage to the bit line BL and the word line WL connected to the cell.

In the large capacity memory cell array described above, in order to reduce a chip area, it is preferable to drive as many word lines as possible using as few word line driver circuits as possible and as few decoder circuits as possible. However, when many word lines are connected to one word line driver circuit, non-selected current also flows in a non-selected memory cell. Therefore, as a result, a word line driver circuit is required which allows a large current to flow and has a large chip area, and thus there is a problem that the chip area becomes even larger than before.

Further, in a case of connecting many word lines to one word line driver circuit, for example, it is preferable to provide a decoder circuit that determines the layer to which the word line to be selected belongs, and a decoder circuit that determines the word line in that layer to be selected. However, in this case, the number of the decoder circuits and the number of the wirings for driving the decoder circuit become too large, which leads to a problem that the chip area becomes even larger than before.

Examples of related art include US-A-2017/0200676.

DETAILED DESCRIPTION

Figure 1:
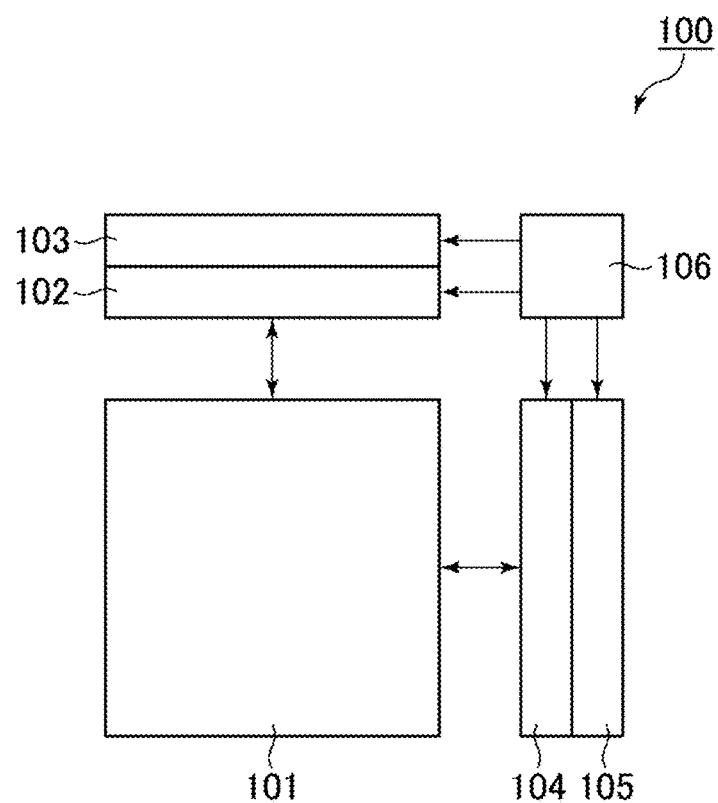
FIG. 1 shows a block diagram of a storage device according to at least one embodiment.

At least one embodiments provides a miniaturized storage device.

In general, according to at least one embodiment, a storage device of an embodiment includes: a substrate; a first conductive layer that is provided on the substrate and extends in a first direction parallel to a substrate surface; a second conductive layer that is provided on the substrate, is adjacent to the first conductive layer in a second direction intersecting the first direction, and extends in the first direction; a third conductive layer that is provided on the first conductive layer and extends in a third direction intersecting the first and second directions; a fourth conductive layer that extends in the second direction; a fifth conductive layer that is provided on the second conductive layer, extends in the third direction, and is electrically connected to the fourth conductive layer; a first storage layer that is provided between the third conductive layer and the fourth conductive layer; a first semiconductor layer that is provided between the first conductive layer and the third conductive layer; a second semiconductor layer that is provided between the second conductive layer and the fifth conductive layer; and a first gate electrode that extends in the second direction and is shared by side surfaces of the first semiconductor layer and the second semiconductor layer.

Hereinafter, embodiments will be described with reference to the drawings. In the drawings, the same or similar reference numerals are attached to the same or similar parts.

In the present specification, in order to indicate a positional relationship of components or the like, an upward direction of the drawing is described as "above" and a downward direction of the drawing as "below". In the specification, concepts of "above" and "below" are not necessarily terms indicating the relationship with the direction of gravity.

Embodiment

A storage device of at least one embodiment includes: a substrate; a first conductive layer that is provided on the substrate and extends in a first direction parallel to a substrate surface; a second conductive layer that is provided on the substrate, is adjacent to the first conductive layer in a second direction intersecting the first direction, and extends in the first direction; a third conductive layer that is provided on the first conductive layer and extends in a third direction intersecting the first and second directions; a fourth conductive layer that extends in the second direction; a fifth conductive layer that is provided on the second conductive layer, extends in the third direction, and is electrically connected to the fourth conductive layer; a first storage layer that is provided between the third conductive layer and the fourth conductive layer; a first semiconductor layer that is provided between the first conductive layer and the third conductive layer; a second semiconductor layer that is provided between the second conductive layer and the fifth conductive layer; and a first gate electrode that extends in the second direction and is shared by side surfaces of the first semiconductor layer and the second semiconductor layer.

Figure 2:
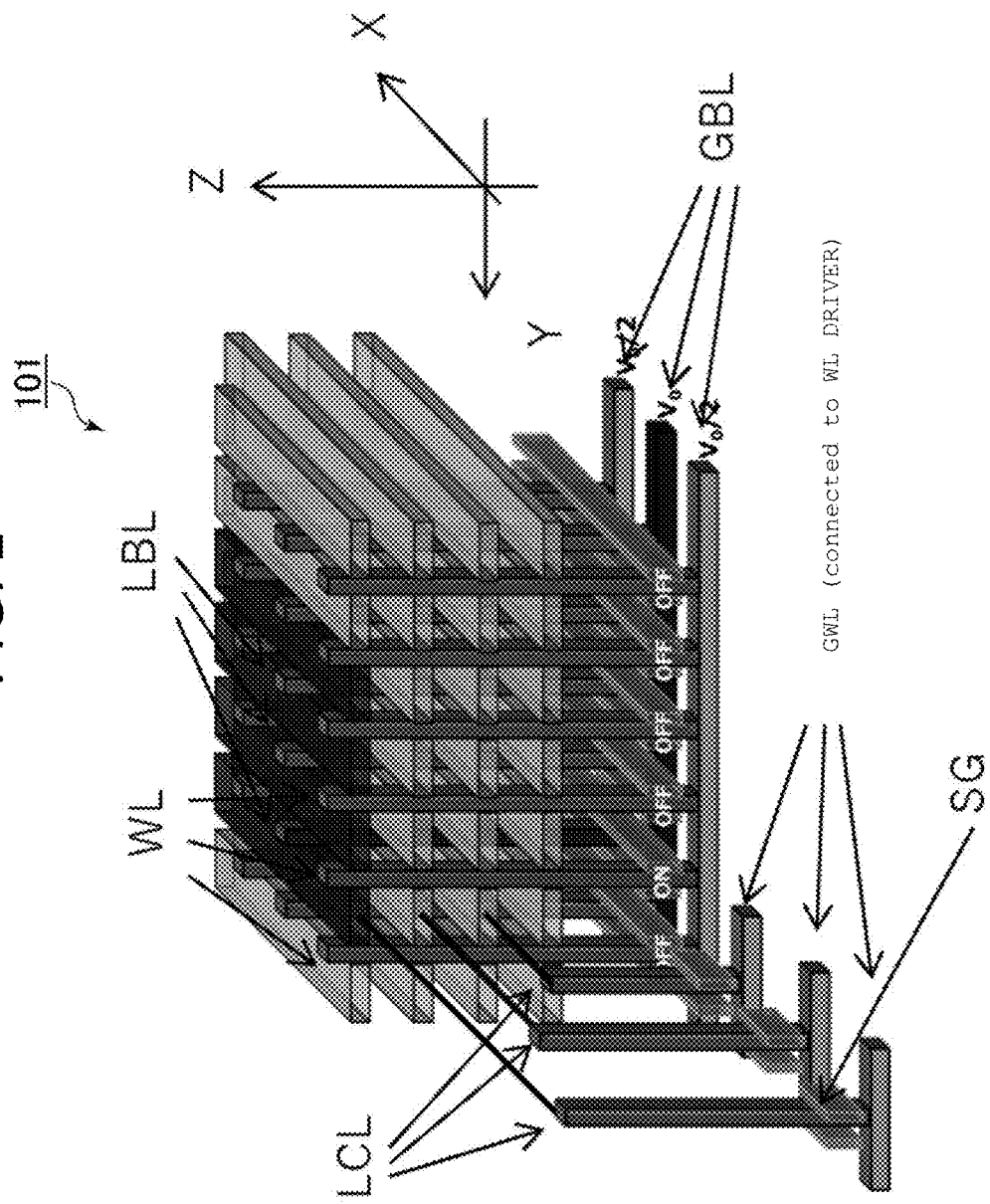
FIG. 2 shows a schematic perspective view of the storage device according to at least one embodiment.
Figure 3:
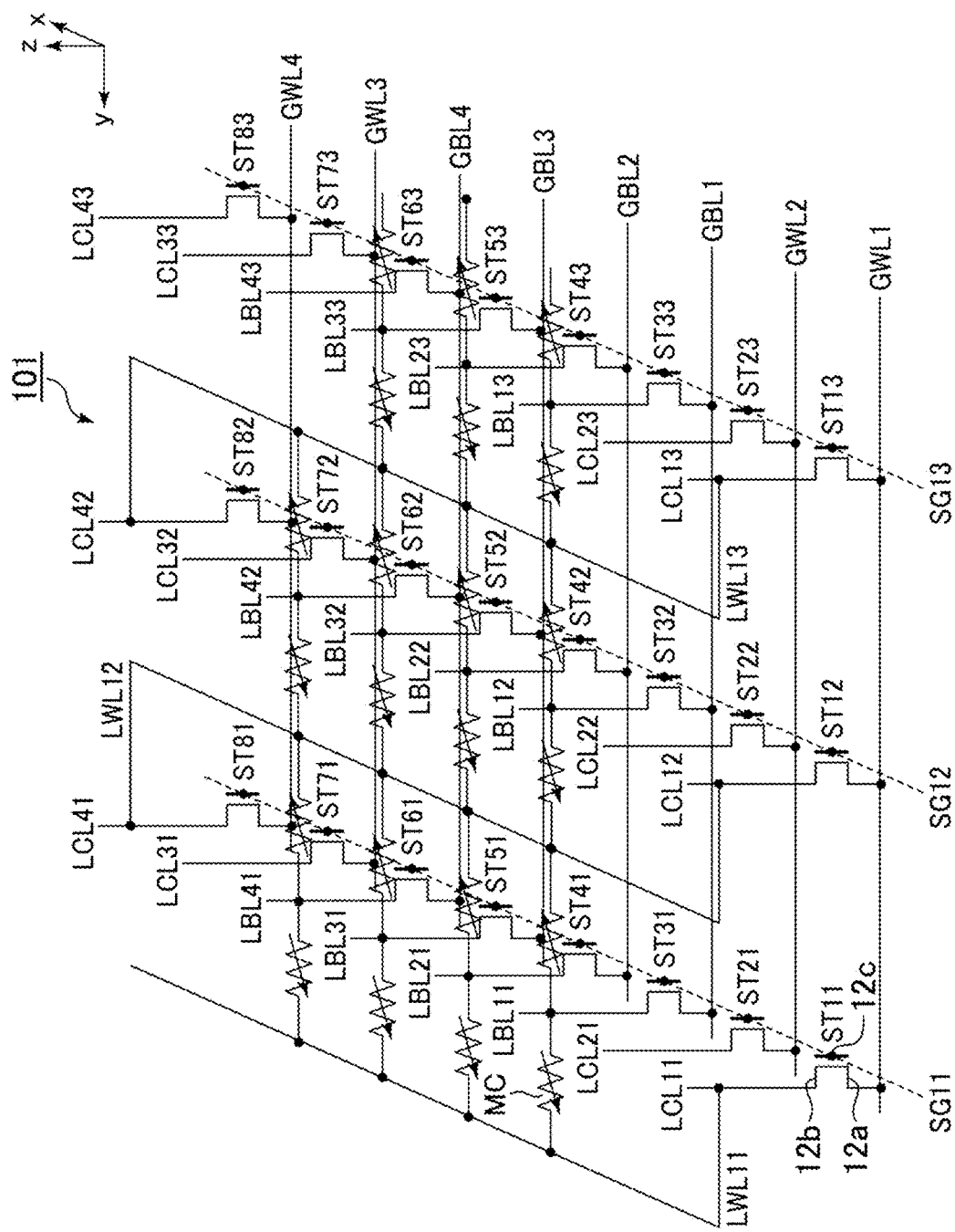
FIG. 3 shows an equivalent circuit diagram of the storage device according to at least one embodiment.

FIG. 1 is a block diagram of a storage device 100 according to at least one embodiment. FIG. 2 is a schematic perspective view of the storage device according to at least one embodiment. FIG. 3 is an equivalent circuit diagram of the storage device according to at least one embodiment.

The storage device 100 of the embodiment may be a resistive random access memory. The resistive random access memory stores data by using a resistance change of a recording portion as a voltage is applied.

Further, a memory cell array 101 of at least one embodiment has a three-dimensional structure in which memory cells are three-dimensionally arranged. By including the three-dimensional structure, the degree of integration of the storage device 100 is improved.

As shown in FIG. 1, the storage device 100 includes the memory cell array 101, a word line driver circuit 102, a row decoder circuit 103, a sense amplifier circuit 104, a column decoder circuit 105, and a control circuit 106.

In FIG. 3, as a global bit line, GBL global bit lines GBL1, GBL2, GBL3, and GBL4 are provided. The global bit line GBL, for example, is provided on a substrate 10 that is set parallel to an xy plane, and extends in a y direction. The y direction is a first direction, a z direction perpendicular to the y direction is a second direction, an x direction perpendicularly intersecting the y direction and the z direction is a specific example of a third direction. The substrate 10 provided parallel to the xy plane is not shown in FIGS. 1 to 3.

In FIG. 3, as a global word line GWL, GWL global word lines GWL1, GWL2, GWL3, and GWL4 are provided. The global word line GWL, for example, is provided on the substrate 10 provided parallel to the xy plane and is extending in the y direction. In FIG. 3, the global bit lines GBL1, GBL2, GBL3, and GBL4 are provided between the global word lines GWL1 and GWL2, and the global word line GWL3 and the global word line GWL4. The substrate 10 provided parallel to the xy plane is not shown in FIG. 3.

In FIG. 3, as a select transistor ST, select transistors ST11, ST21, ST31, ST41, ST51, ST61, ST71, ST81, ST12, ST22, ST32, ST42, ST52, ST62, ST72, ST82, ST13, ST23, ST33, ST43, ST53, ST63, ST73, and ST83 are provided. The select transistor ST is, for example, a thin film transistor (TFT). Each of the select transistors ST has a connection portion 12a, a connection portion 12b, and a control electrode 12c. The control electrode 12c is a gate electrode of the TFT. Here, the TFT has a semiconductor layer and the gate electrode provided on a side surface of the semiconductor layer.

The connection portions 12a of the select transistors ST11, ST12, and ST13 are connected to the global word line GWL1. The connection portions 12a of the select transistors ST21, ST22, and ST23 are connected to the global word line GWL2. The connection portions 12a of the select transistors ST31, ST32, and ST33 are connected to global bit line GBL1. The connection portions 12a of the select transistors ST41, ST42, and ST43 are connected to the global bit line GBL2. The connection portions 12a of the select transistors ST51, ST52, and ST53 are connected to the global bit line GBL3. The connection portions 12a of the select transistors ST61, ST62, and ST63 are connected to the global bit line GBL4. The connection portions 12a of the select transistors ST71, ST72, and ST73 are connected to the global word line GWL3. The connection portions 12a of the select transistors ST81, ST82, and ST83 are connected to the global word line GWL4.

The control electrodes 12c of the select transistors ST11, ST21, ST31, ST41, ST51, ST61, ST71, and ST81 are connected by a select gate line SG11. The control electrodes 12c of the select transistors ST12, ST22, ST32, ST42, ST52, ST62, ST72, and ST82 are connected by a select gate line SG12. The control electrodes 12c of ST13, ST23, ST33, ST43, ST53, ST63, ST73, and ST83 are connected by a select gate line SG13.

In FIG. 3, as a bit line LBL, bit lines LBL11, LBL12, LBL13, LBL21, LBL22, LBL23, LBL31, LBL32, LBL33, LBL41, LBL42, and LBL43 are shown. The bit lines LBL11, LBL12, and LBL13 are connected to the connection portions 12b of the select transistors ST31, ST32, and ST33, respectively. The bit lines LBL21, LBL22, and LBL23 are connected to the connection portions 12b of the select transistors ST41, ST42, and ST43, respectively. The bit lines LBL31, LBL32, and LBL33 are connected to the connection portions 12b of the select transistors ST51, ST52, and ST53, respectively. The bit lines LBL41, LBL42, and LBL43 are connected to the connection portion 12b of the select transistors ST61, ST62, and ST63, respectively. The bit line LBL extends in the z direction.

In FIG. 3, as a word line connection line, word line connection lines LCL11, LCL12, LCL13, LCL21, LCL22, LCL23, LCL31, LCL32, LCL33, LCL41, LCL42, and LCL43 are provided. The word line connection lines LCL11, LCL12, and LCL13 are connected to the connection portions 12b of the select transistors ST11, ST12, and ST13, respectively. The word line connection lines LCL21, LCL22, and LCL23 are connected to the connection portions 12b of the select transistors ST21, ST22, and ST23, respectively. The word line connection lines LCL31, LCL32, and LCL33 are connected to the connection portions 12b of the select transistors ST71, ST72, and ST73, respectively. The word line connection lines LCL41, LCL42, and LCL43 are connected to the connection portions 12b of the select transistors ST81, ST82, and ST83, respectively. The word line connection line LCL is extending, for example, in the z direction.

Word lines LWL are provided on the select transistors ST. A word line LWL12 is provided between the bit lines LBL11, LBL21, LBL31, and LBL41, the word line connection lines LCL11, LCL21, LCL31, and LCL41, and the bit lines LBL12, LBL22, LBL32, and LBL42, the word line connection lines LCL12, LCL22, LCL32, and LCL42. The word line LWL12 is extending in the x direction and is connected to the word line connection line LCL12 and the word line LCL41. A word line LWL11 is provided such that the bit lines LBL11, LBL21, LBL31, and LBL41, the word line connection lines LCL11, LCL21, LCL31, and LCL41 are provided between the word line LWL11 and the word line LWL12. The word line LWL11 extends in the x direction, and is connected to the word line connection line LCL11. A word line LWL13 is provided between the bit lines LBL12, LBL22, LBL32, and LBL42, the word line connection lines LCL12, LCL22, LCL32, and LCL42, and the bit lines LBL13, LBL23, LBL33, and LBL43, the word line connection lines LCL13, LCL23, LCL33, and LCL43, extends in the x direction, and is connected to the word line connection line LCL13 and the word line connection line LCL42.

Word lines LWL21, LWL22, and LWL23 are provided on the word lines LWL11, LWL12, and LWL13, respectively, and are extending in the x direction. The word line LWL21 is connected to the word line connection line LCL21. The word line LWL22 is connected to the word line connection line LCL22 and the word line connection line LCL31. The word line LWL23 is connected to the word line connection line LCL23 and the word line connection line LCL32.

The column decoder circuit 105 has a function of selecting the global bit line GBL according to an input column address signal. The sense amplifier circuit 104 has a function of applying a predetermined voltage to the global bit line GBL selected by the column decoder circuit 105. The sense amplifier circuit 104 has a function of detecting and amplifying a current flowing between the selected global bit line GBL and the selected global word line GWL.

The select gate lines SG11, SG12, and SG13 are connected to the column decoder circuit 105. By inputting the signal to the select gate line SG11 using the column decoder circuit 105, ST11, ST21, ST31, ST41, ST51, ST61, ST71, and ST81 can be turned on and off at once. By inputting the signal to the select gate line SG12 using the column decoder circuit 105, ST12, ST22, ST32, ST42, ST52, ST62, ST72, and ST82 can be turned on and off at once. By inputting the signal to the select gate line SG13 using the column decoder circuit 105, ST13, ST23, ST33, ST43, ST53, ST63, ST73, and ST83 can be turned on and off at once.

The row decoder circuit 103 has a function of selecting the global word line GWL according to an inputted row address signal. The word line driver circuit 102 has a function of applying a predetermined voltage to the global word line GWL selected by the row decoder circuit 103.

A manner in which the column decoder circuit 105, the row decoder circuit 103, the global word line GWL, the global bit line GBL, and the select gate line SG are connected is not limited to the above description.

The control circuit 106 has a function of controlling the word line driver circuit 102, the row decoder circuit 103, the sense amplifier circuit 104, the column decoder circuit 105, and the other circuit (not shown).

Circuits such as the word line driver circuit 102, the row decoder circuit 103, the sense amplifier circuit 104, the column decoder circuit 105, and the control circuit 106 are electronic circuits, and are configured with, for example, a transistor using the semiconductor layer and a wiring layer (not shown).

The memory cell array 101 includes, for example, the word line connection line LCL, the bit line LBL, and the word line LWL. A memory cell MC is disposed between the bit line LBL and the word line LWL.

The global word line GWL, the global bit line GBL, the bit line LBL, the word line connection line LCL and the word line LWL are conductive layers. The global word line GWL, the global bit line GBL, the bit line LBL, the word line connection line LCL and the word line LWL are, for example, metal layers. The global word line GWL, the global bit line GBL, the bit line LBL, the word line connection line LCL, and the word line LWL include, for example, tungsten, titanium nitride, or copper. The global word line GWL, the global bit line GBL, the bit line LBL, the word line connection line LCL, and the word line LWL may be formed of other metal, metal semiconductor compound, or conductive material such as a semiconductor.

Insulators and barrier metals (not shown) are appropriately disposed between the global word line GWL, the global bit line GBL, the bit line LBL, the word line connection line LCL and the word line LWL.

An example of the first conductive layer is the GBL2, an example of the second conductive layer is the GWL1, an example of a first transistor is the ST42, an example of a second transistor is ST12, an example of a third transistor is the ST82, an example of the third conductive layer is the LBL22, an example of the fourth conductive layer is the LWL12, an example of the fifth conductive layer is the LCL12, an example of a sixth conductive layer is the GWL4, an example of a seventh conductive layer is the LWL13, and an example of an eighth conductive layer is the LCL42.

Figure 4:
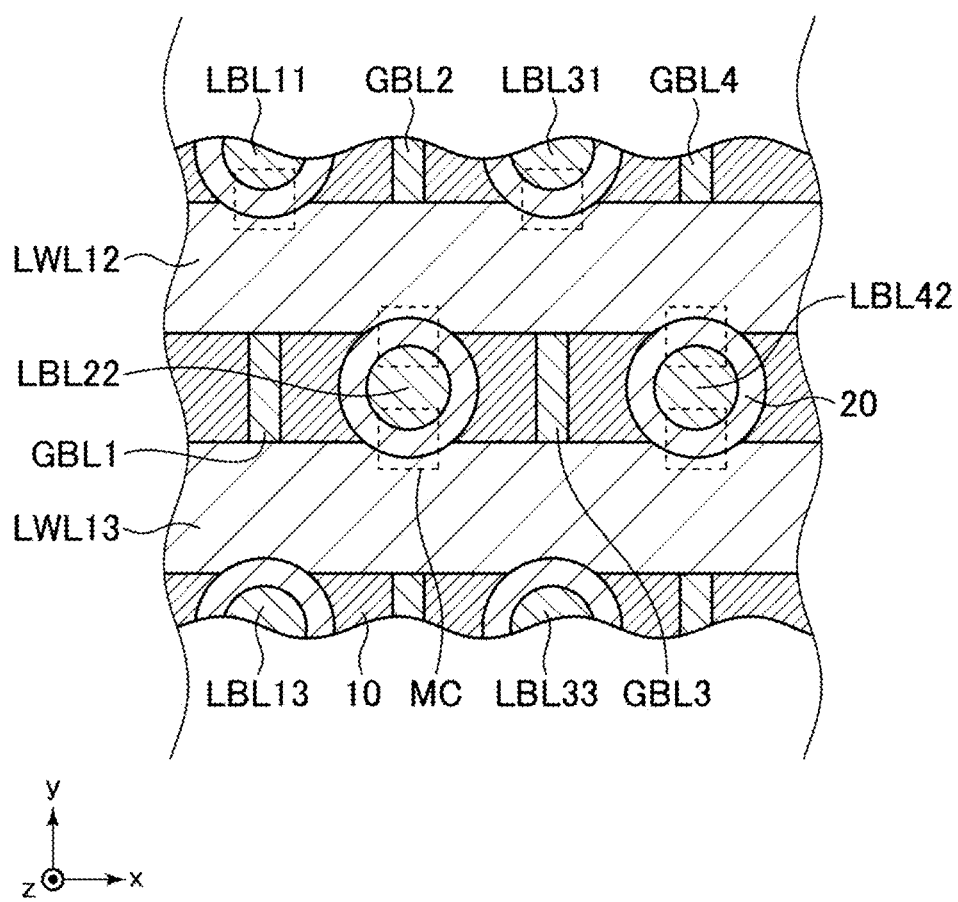
FIG. 4 shows a schematic sectional view of a main part of the storage device according to at least one embodiment.

FIG. 4 is a schematic view of a main part of the storage device 100 of at least one embodiment. FIG. 4 is a schematic view of a periphery of the memory cell MC in a plane parallel to the xy plane.

In FIG. 4, as the global bit line GBL formed on the substrate 10, GBL1, GBL2, GBL3, and GBL4 are shown. In FIG. 4, the bit lines LBL11, LBL13, LBL22, LBL31, LBL33, and LBL42 are described. In FIG. 4, descriptions of the bit lines LBL12, LBL21, LBL23, LBL32, LBL41, and LBL43 are omitted. In addition, descriptions of the select transistors ST32, ST41, ST43, ST52, ST61, and ST63 are omitted.

A variable resistance layer 20 is provided around the bit line LBL. A shape of the variable resistance layer 20 is, for example, a columnar shape in which the bit line LBL is provided and extends in the z direction. The variable resistance layer 20 is connected to the bit line LBL and the word line LWL by the wiring (not shown). For example, in a case of the variable resistance layer 20 provided around the bit line LBL22, memory cells MC are formed in the part of the variable resistance layer 20 provided between the bit line LBL22 and the word line LWL12 (recording portion or storage layer), and the part of the variable resistance layer 20 provided between the bit line LBL22 and the word line LWL13 (recording portion or recording layer), respectively.

The variable resistance layer 20 includes a material of which a resistance changes by applying of the voltage. The variable resistance layer 20 includes, for example, a chalcogenide including germanium (Ge), antimony (Sb), tellurium (Te), binary transition metal oxides such as NiO and $TiO_2$, a solid electrolyte such as GeS or CuS, or perovskite type oxide such as $Pr_{0.7}Ca_{0.3}MnO_3$, $SrTiO_3$.

In FIG. 4, descriptions of the insulator and the barrier metal are omitted.

Next, an example of an operation of the storage device 100 will be described. For example, in a case where writing is performed on the memory cell MC provided between the bit line LBL22 and the word line LWL12, a predetermined voltage is applied to the select gate line SG12, and the select transistors ST12, ST22, ST32, ST42, ST52, ST62, ST72, and ST82 are turned on. A write voltage $V_0$ is applied to the GBL2. Then, 0 V is applied to the GWL1. For example, a voltage ($V_0/2$) half the write voltage $V_0$ is applied to the other global bit line GBL and the other global word line GWL. Accordingly, writing is performed on the memory cell MC provided between the bit line LBL22 and the word line LWL12.

Next, an operation and effect of at least one embodiment will be described.

In the storage device of the embodiment, the word line LWL is connected to the global word line GWL via the word line connection line LCL and the select transistor ST. Therefore, with the select transistor ST, it is possible to select the word line LWL connected to the memory cell MC on which writing is to be performed, and thus the number of non-selected memory cells through which non-selected current flows can be reduced. Therefore, since a word line driver circuit having a small chip area can be used, a miniaturized storage device can be provided.

MC provided between the bit line LBL22 and the word line LWL12, when the ST12 and the ST42 are turned on and off using the common selection gate SG12, it is possible to reduce the number of the selection gates SG, and carry out the operation with one selection gate. Therefore, a miniaturized storage device can be provided.

As shown in FIG. 3, the global word lines GWL can be provided so that they sandwich the global bit lines GBL, in other words, can be provided on the right and left of the global bit lines GBL in the x direction. In this case, since the word line LWL and the global word line GWL are easily arranged, a more miniaturized storage device can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a substrate;
   a first conductive layer disposed on the substrate and extending in a first direction parallel to the substrate surface;
   a second conductive layer disposed on the substrate, is adjacent to the first conductive layer in a second direction intersecting the first direction, and extends in the first direction;
   a third conductive layer disposed on the first conductive layer and extending in a third direction intersecting the first and second directions;
   a fourth conductive layer extending in the second direction;
   a fifth conductive layer disposed on the second conductive layer, extends in the third direction, and is electrically connected to the fourth conductive layer;
   a first storage layer disposed between the third conductive layer and the fourth conductive layer;
   a first semiconductor layer disposed between the first conductive layer and the third conductive layer;
   a second semiconductor layer disposed between the second conductive layer and the fifth conductive layer; and
   a first gate electrode extending in the second direction and being shared by side surfaces of the first semiconductor layer and the second semiconductor layer,
   wherein a storage layer is not provided between the fifth conductive layer and the fourth conductive layer.

2. The storage device according to claim 1, further comprising:
   a sixth conductive layer disposed on the substrate and extending in the first direction, the first conductive layer disposed between the second conductive layer and the sixth conductive layer;
   a seventh conductive layer adjacent to the fourth conductive layer in the first direction and extending in the second direction;
   an eighth conductive layer disposed on the sixth conductive layer, extends in the third direction, and is electrically connected to the seventh conductive layer;
   a second storage layer disposed between the third conductive layer and the seventh conductive layer; and
   a third semiconductor layer disposed between the sixth conductive layer and the eighth conductive layer and is provided with the first gate electrode on a side surface,
   wherein a storage layer is not provided between the seventh conductive layer and the eighth conductive layer.

3. The storage device according to claim 2, wherein the third conductive layer is disposed between the fourth conductive layer and the seventh conductive layer.

4. The storage device according to claim 2, further comprising:
   a ninth conductive layer adjacent to the second conductive layer in the second direction and extending in the first direction;
   a tenth conductive layer disposed between the substrate and the fourth conductive layer and extending in the second direction;
   an eleventh conductive layer disposed on the ninth conductive layer, extends in the third direction, and is electrically connected to the tenth conductive layer;
   a third storage layer disposed between the third conductive layer and the tenth conductive layer; and
   a fourth semiconductor layer disposed between the ninth conductive layer and the eleventh conductive layer and provided with a first gate electrode on a side surface.

5. The storage device according to claim 1, wherein the storage device is a resistive random access memory.

6. The storage device according to claim 1, further comprising a plurality of memory cells arranged in an array.

7. The storage device according to claim 6, wherein the memory cells are arranged in a three-dimensional array.

8. The storage device according to claim 1, wherein the conductive layers include metal layers.

9. The storage device according to claim 1, wherein the first storage layer comprises a variable resistance layer.

10. The storage device according to claim 9, wherein the variable resistance layer has a columnar shape.

11. The storage device according to claim 9, wherein the variable resistance layer comprises a material of a chalcogenide, a binary transition metal oxide, a solid electrolyte, or a perovskite type oxide.

* * * * *